US009437602B2

(12) United States Patent
Chakrabartty et al.

(10) Patent No.: US 9,437,602 B2
(45) Date of Patent: Sep. 6, 2016

(54) TEMPERATURE COMPENSATION METHOD FOR HIGH-DENSITY FLOATING-GATE MEMORY

(71) Applicant: Board of Trustees of Michigan State University, East Lansing, MI (US)

(72) Inventors: Shantanu Chakrabartty, Williamston, MI (US); Ming Gu, Lansing, MI (US); Chenling Huang, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 32 days.

(21) Appl. No.: 14/362,256

(22) PCT Filed: Nov. 27, 2012

(86) PCT No.: PCT/US2012/066584
§ 371 (c)(1),
(2) Date: Jun. 2, 2014

(87) PCT Pub. No.: WO2013/081991
PCT Pub. Date: Jun. 6, 2013

(65) Prior Publication Data
US 2015/0008496 A1 Jan. 8, 2015

Related U.S. Application Data

(60) Provisional application No. 61/566,251, filed on Dec. 2, 2011.

(51) Int. Cl.
*H01L 29/788* (2006.01)
*H01L 27/115* (2006.01)
(Continued)

(52) U.S. Cl.
CPC ........... *H01L 27/11526* (2013.01); *G11C 7/04* (2013.01); *G11C 16/0408* (2013.01);
(Continued)

(58) Field of Classification Search
None
See application file for complete search history.

(56) References Cited

U.S. PATENT DOCUMENTS 5,231,316 A 7/1993 Thelen, Jr.
6,107,868 A 8/2000 Diniz et al.
(Continued)

FOREIGN PATENT DOCUMENTS

WO WO-2009122405 A2 10/2009

OTHER PUBLICATIONS

N. Lajnef et al., "A Sub-Microwatt Piezo-Floating-Gate Sensor for Long-Term Fatigue Monitoring in Biomechanical Implants", Proceedings of the 28th IEEE, ENBS Annual International Conference (2006).
(Continued)

*Primary Examiner* — Robert Bachner
(74) *Attorney, Agent, or Firm* — Harness, Dickey & Pierce, P.L.C.

(57) ABSTRACT

A temperature compensation technique is provided for a non-volatile memory arrangement. The memory arrangement includes: a memory circuit (12) having a floating gate transistor (P3) operating in weak-inversion mode and a varactor ($C_v$) with a terminal electrically coupled to a gate node of the floating gate transistor; a first current reference circuit (14) having a floating gate transistor (PI); a second current reference circuit (16) having a floating gate transistor (P2); and a control module (18) configured to selectively receive a reference current ($I_1$, $I_2$) from a drain of the floating gate transistor in each of the first and second current reference circuits. The control module operates to determine a ratio between the reference currents received from the first and second current reference circuits, generate a tuning voltage ($V_x$) in accordance with the ratio between the reference currents and apply the tuning voltage to the varactor in the memory circuit.

16 Claims, 13 Drawing Sheets

(51) Int. Cl.
  *G11C 7/04* (2006.01)
  *G11C 16/04* (2006.01)
  *G11C 27/00* (2006.01)
  *G11C 27/02* (2006.01)
  *H01L 27/06* (2006.01)
  *H01L 49/02* (2006.01)

(52) U.S. Cl.
  CPC ......... *G11C16/0441* (2013.01); *G11C 27/005* (2013.01); *G11C 27/028* (2013.01); *H01L 27/0629* (2013.01); *H01L 28/40* (2013.01)

(56) References Cited

U.S. PATENT DOCUMENTS

| | | |
|---|---|---|
| 6,528,842 B1 | 3/2003 | Luich et al. |
| 6,870,766 B2 | 3/2005 | Cho et al. |
| 7,057,958 B2 | 6/2006 | So et al. |
| 7,429,888 B2 | 9/2008 | Owen |
| 7,957,215 B2 | 6/2011 | Tanzawa |
| 2004/0105306 A1 | 6/2004 | Marotta et al. |
| 2006/0133171 A1* | 6/2006 | Tonda ............... G11C 7/04 365/185.01 |
| 2007/0007999 A1 | 1/2007 | Graham et al. |
| 2007/0046369 A1* | 3/2007 | Schober ............ G06K 19/0707 330/7 |
| 2008/0047355 A1 | 2/2008 | Chakrabartty et al. |
| 2010/0110815 A1 | 5/2010 | Lee et al. |
| 2010/0156871 A1 | 6/2010 | Barrow |
| 2010/0177232 A1* | 7/2010 | Yu ................... H04N 5/3698 348/308 |
| 2010/0246267 A1 | 9/2010 | Hasler et al. |
| 2012/0074998 A1* | 3/2012 | Brett ................ H03L 1/022 327/157 |

OTHER PUBLICATIONS

Shantanu Chakrabartty et al "Sub-Microwatt Analog VLSI Trainable Pattern Classifier", IEEE Journal of Solid-State Circuits, vol. 23, No. 5, pp. 1169-1179 (May 1, 2007).

V. Srinivasan, et al., "A Floating-Gate-Based Programmable CMOS Reference", IEEE Transactions on Circuits and Systems—I: Regular Papers, vol. 55, No. 11 (Dec. 2008).

* cited by examiner

TEMPERATURE COMPENSATION METHOD FOR HIGH-DENSITY FLOATING-GATE MEMORY

CROSS-REFERENCE TO RELATED APPLICATIONS

This application is a 371 U.S. National Phase of PCT/US2012/066584, filed on Nov. 27, 2012, which claims the benefit of U.S. Provisional Application No. 61/566,251 filed on Dec. 2, 2011. The entire disclosures of the above applications are incorporated herein by reference.

GOVERNMENT RIGHTS

This invention was made with Government support under Contract No. CMMI 0954752; CMMI 0700632; and CCF 0728996 awarded by the National Science Foundation. The U.S. Government has certain rights in this invention.

FIELD

The present disclosure relates to non-volatile memory circuit and, more particularly, to a temperature compensation technique for a high density floating-gate memory.

BACKGROUND

Implementation of analog processors and neural systems require compact storage of a large number of analog parameters (voltage or current). In this regard, floating-gate (FG) transistors are attractive for implementing high-density, non-volatile current memories. Two types of FG current-memories have been reported in literature and are summarized below. With reference to FIG. 1A, the first variant of the FG current memory consists of a pre-compensation stage formed by a FG transistor $P_1$ and an output transistor $P_2$, which forms the current memory cell. A and B are the floating-gate nodes where the charge is stored. Because the nodes are completely insulated by high quality silicon-dioxide, any charge trapped on it is retained for a long period of time (8 bits retention accuracy for less than 8 years). If $Q_A$ and $Q_B$ denote the charge stored on nodes A and B respectively, then the output current $I_{out}$ can be expressed as $$I_{out} \approx I_{ref} \exp\left(\kappa \frac{Q_B - Q_A}{C_T U_T}\right), \quad (1)$$

where $\kappa$ is the gate-efficiency factor, $C_T$ is the total capacitance seen at nodes A and B, and $U_T = kT/q$ is the thermal voltage which is directly proportional to temperature T. Equation (1) illustrates that $I_{out}$ exhibits an exponential dependence with respect to temperature.

With reference to FIG. 1B, the second variant of the FG current memory overcomes this problem by using a modified version of a standard PTAT. Note that instead of using different sizes of pMOS transistors in the current mirror, the circuit uses a floating-gate voltage element formed by the capacitor C. If the charge on C is denoted by Q and if all the transistors are biased in weak-inversion, then the output current is given by $$I_{out} \approx \kappa Q/C_T R, \quad (2)$$

where $C_T$ is again the total capacitance seen at node D. Provided the resistance R is compensated for temperature, the output current will also be compensated for temperature.

However, compared to the current memory in FIG. 1A, the memory shown in FIG. 1B requires a large resistance (>100MΩ) for generating sub-threshold currents, which prohibits its application for high-density arrays. Also, the quality of temperature compensation deteriorates at ultra-low currents or when active resistances are used for emulating a larger R. Hence, an alternative approach is proposed for implementing temperature-compensated floating-gate current memories that can achieve high integration density.

This section provides background information related to the present disclosure which is not necessarily prior art.

SUMMARY

A temperature compensation technique is provided for a non-volatile memory arrangement. The non-volatile memory arrangement is comprised generally of a memory circuit having a floating gate transistor operating in weak-inversion mode, and a varactor electrically coupled to a gate node of the floating gate transistor; and a control module that operates to tune a voltage applied to the varactor, thereby compensating for temperature changes.

In one aspect of this disclosure, the memory arrangement further includes a first and second current reference circuit, each having a floating fate transistor and a varactor with a terminal electrically coupled to a gate node of the floating gate transistor; and a control module configured to selectively receive a reference current from a drain of the floating gate transistor in each of the first and second current reference circuits. The control module operates to determine a ratio between the reference currents received from the first and second current reference circuits, generate a tuning voltage in accordance with the ratio between the reference currents and apply the tuning voltage to the varactor in the memory circuit.

In another aspect of this disclosure, the memory arrangement includes an array of memory circuits and the control module applies a tuning voltage to the varactor in each of the memory circuits.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

DRAWINGS

Figure 1A:
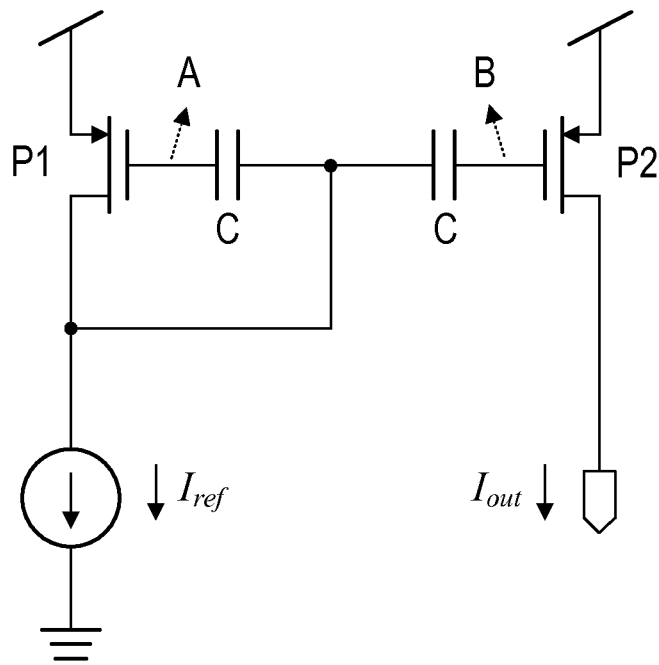
FIG. 1A is a schematic of a conventional current memory circuit.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Figure 2:
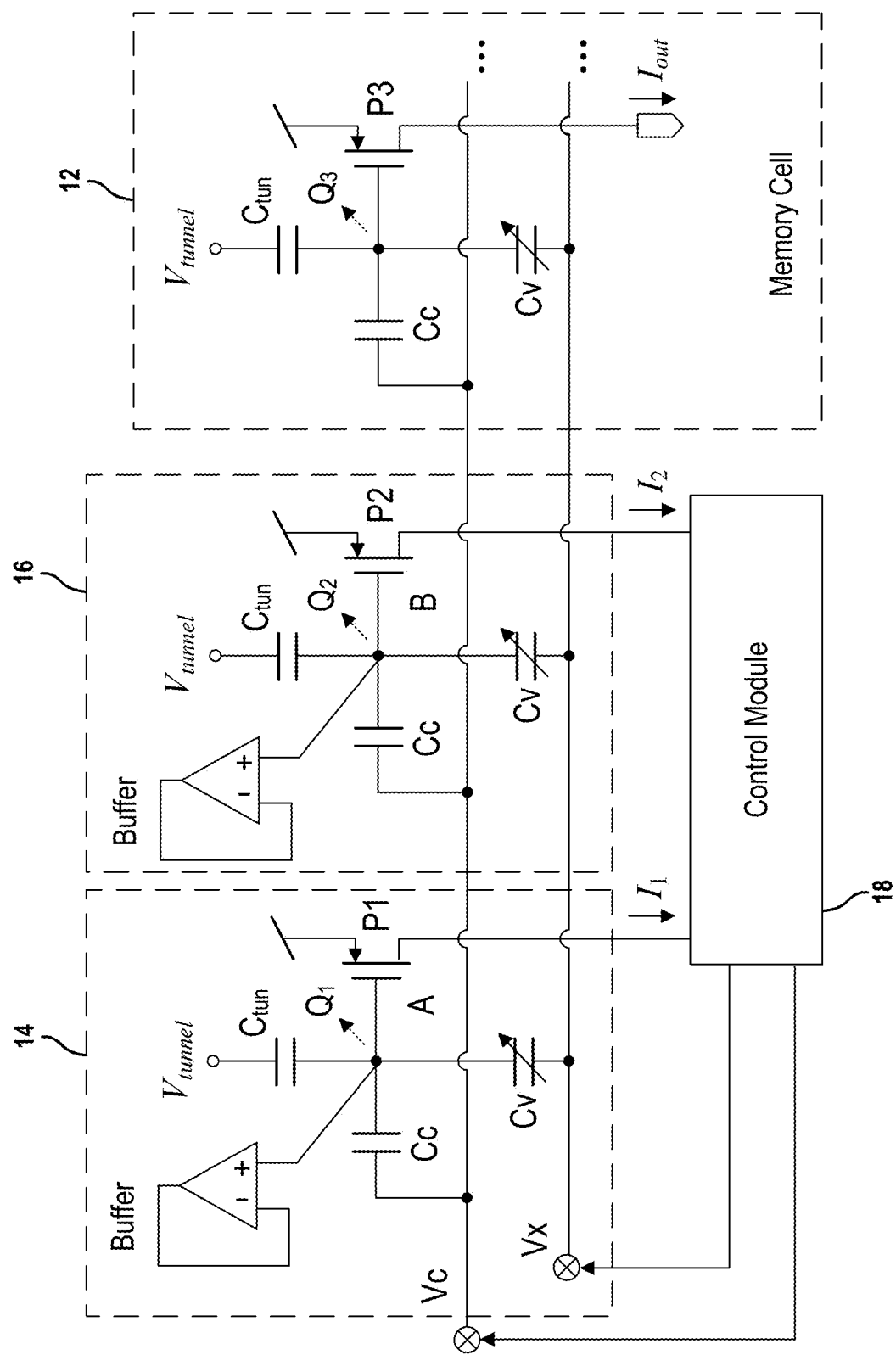
FIG. 2 is a schematic of an exemplary non-volatile memory arrangement according to the present disclosure.

FIG. 2 depicts an exemplary non-volatile memory arrangement 10 according to the disclosure. The non-volatile memory arrangement 10 is comprised generally of a memory cell 12, a first current reference circuit 14, a second current reference circuit 16, and a control module 18. The control module 18 implements a temperature compensation technique as will be further described below. As used herein, the term module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

In one example embodiment, the memory cell 12 includes a floating gate transistor P3 operating in weak-inversion mode and a varactor $C_v$ (also referred to as a varicap diode) with first terminal electrically coupled to a gate node of the floating gate transistor P3. The varactor $C_v$ may be further defined as a metal-oxide semiconductor capacitor although other types of varactors fall within the scope of this disclosure. The memory cell 12 may further include a tunneling capacitor $C_{TUN}$ coupled electrically to the gate node of the floating gate transistor and a control-gate capacitor $C_c$ coupled electrically to the gate node of the floating gate transistor P3. The tunneling capacitor $C_{TUN}$ is configured to receive an injection current for the memory circuit from another current source (not shown). Programming the memory cells can be based on hot-electron injection and Fowler-Nordheim tunneling; details of which fall outside the scope of this disclosure but may be found, for example, in S. Chakrabartty and G. Cauwenberghs, "Sub-microwatt analog VLSI trainable pattern classifier," IEEE J. Solid-State Circuits, vol. 42, no. 5, pp. 1169-1179, May 2007. While reference is made to a particular memory cell arrangement, temperature compensation techniques presented herein are extendable to other cell arrangements based on floating-gate transistors.

In the example embodiment, the first and second current reference circuits 14, 16 are comprised of floating-gate transistors P1, P2. Each current reference circuit further includes a tunneling capacitor $C_{TUN}$ coupled electrically to the gate node of the corresponding floating gate transistor and a control-gate capacitor $C_c$ coupled electrically to the gate node of the corresponding floating gate transistor. Likewise, the tunneling capacitor $C_{TUN}$ is configured to receive a tunneling current from another voltage source (not shown). Other circuit arrangements are also contemplated by this disclosure.

The control module 18 is configured to selectively receive a reference current from a drain of the floating gate transistor in each of the first and second current reference circuits 14, 16. The control module 18 receives the reference current periodically or in accordance with some other predefined sampling scheme. Upon receipt of the reference currents, the control module 18 determines a ratio between the reference currents and generates a tuning voltage in accordance with the ratio between the reference currents as further described below.

More specifically, the currents through $P_1$ and $P_2$ (measured using an on-chip analog-to-digital converter) are controlled by a control module 18 which sets the control-gate voltage $V_c$ and tuning voltage $V_x$ using an off-chip digital-to-analog converter. If the charge on the floating-gate nodes A and B are denoted by $Q_1$ and $Q_2$, then the gate voltages for the pMOS transistors $P_1$ and $P_2$ are given by $$V_A \approx \frac{Q_1 + C_c \cdot V_c + C_v \cdot V_x + C_{tun} \cdot V_{tunnel} + C_b \cdot V_{dd}}{C_T}, \quad (3)$$

$$V_B \approx \frac{Q_2 + C_c \cdot V_c + C_v \cdot V_x + C_{tun} \cdot V_{tunnel} + C_b \cdot V_{dd}}{C_T}. \quad (4)$$

When $P_1$ and $P_2$ are biased in weak-inversion, the respective ratio of their drain-currents $I_1$ and $I_2$ is given by $$\frac{I_2}{I_1} = \exp\left(\kappa \frac{Q_1 - Q_2}{C_T U_T}\right). \quad (5)$$

The control module 18 monitors $I_1$ and $I_2$ and ensures that their ratio remains constant across temperature variations by tuning the voltage $V_x$ which changes the capacitance $C_T$. Letting $K = I_2/I_1$, then the parameter $C_T U_T$ is also held constant according to $$C_T U_T = \kappa \frac{Q_1 - Q_2}{\log(K)} \quad (6)$$

which leads to the expression for the output current $I_{out}$ generated through the memory cell as $$\frac{I_2}{I_{out}} = \exp\left[\log(K) \frac{Q_3 - Q_2}{Q_1 - Q_2}\right]. \quad (7)$$

Figure 1B:
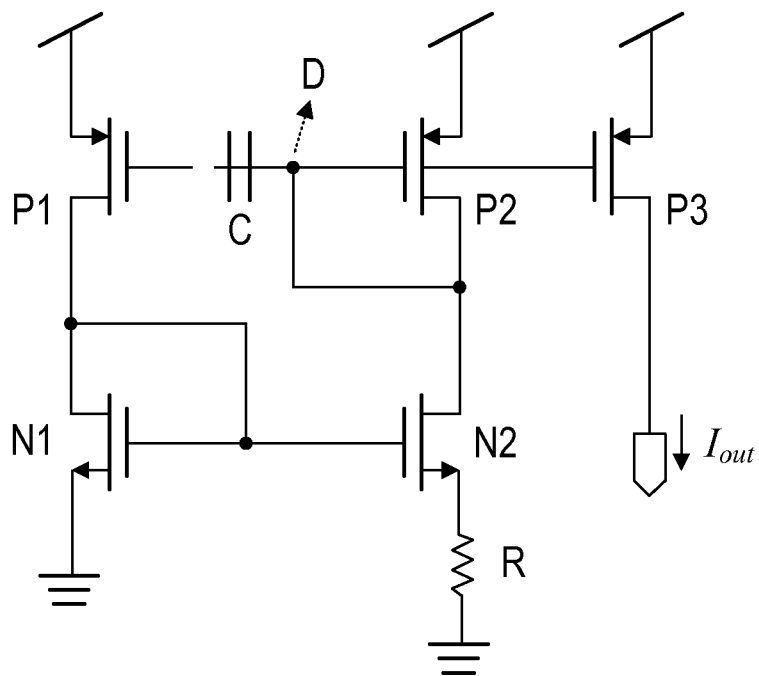
FIG. 1B is a schematic of a conventional current memory circuit having proportional to absolute temperature (PTAT) compensation.

Thus, if the current $I_2$ is compensated for temperature, then according to equation (7), the current through the memory cells are also temperature compensated. In principle, $I_2$ could be generated by a bandgap reference circuit or by a circuit similar to FIG. 1B. For this implementation, $I_2$ is maintained to be constant by co-adapting the control-gate voltage $V_c$ along with the tuning voltage $V_x$. It is envisioned that this temperature compensation technique may be extended to transistors operating in modes other than weak-inversion mode.

Figure 3:
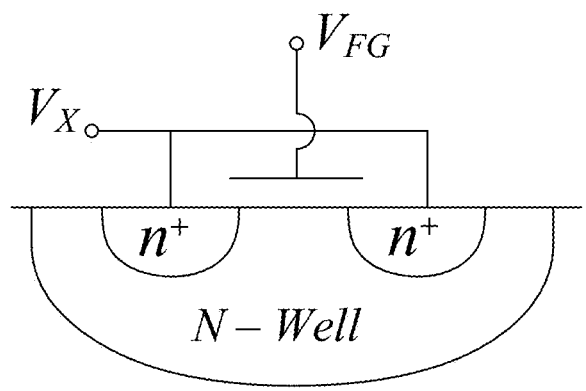
FIG. 3 is a cross-sectional diagram of an exemplary MOS varactor.
Figure 4:
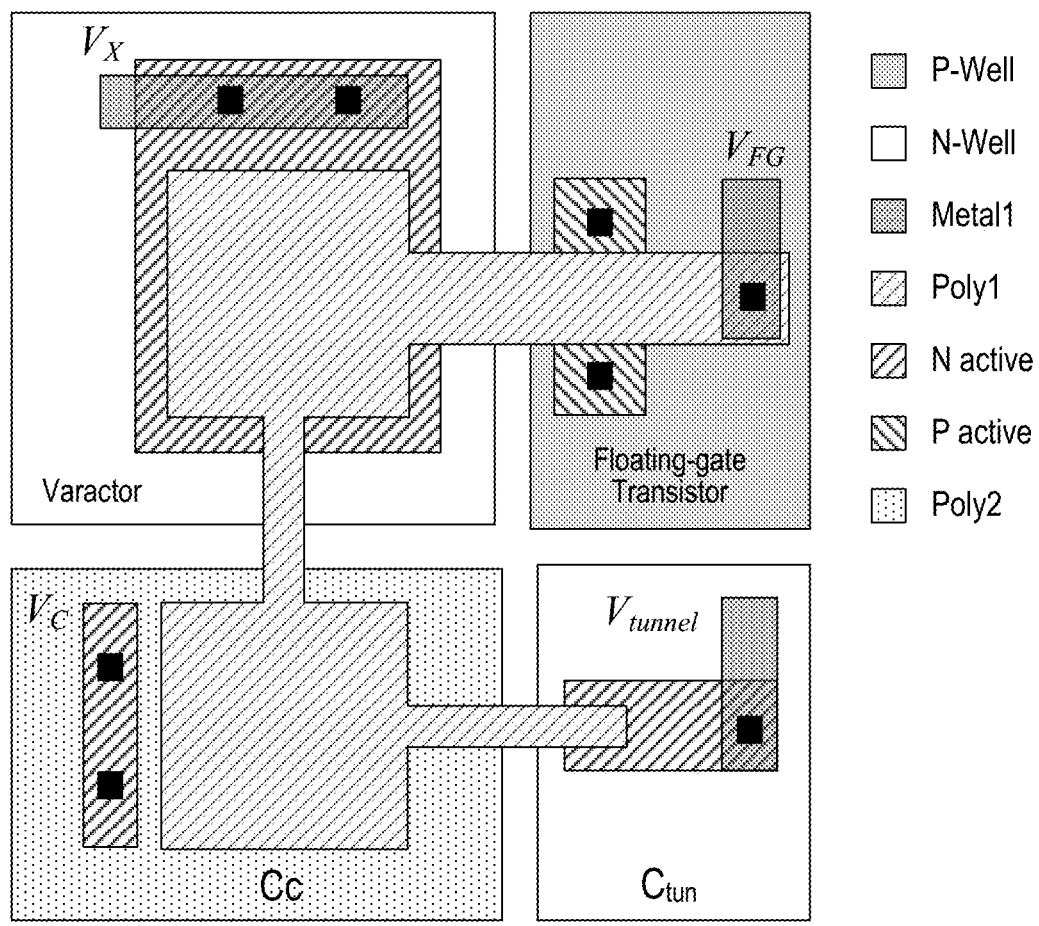
FIG. 4 is a diagram of an exemplary layout of the memory cell show in FIG. 2.

In an exemplary embodiment, the varactor is realized using a MOS capacitor which operates in an accumulation mode. FIG. 3 depicts the cross-sectional architecture of the MOS capacitor; whereas FIG. 4 illustrates an exemplary layout for a memory cell having the MOS capacitor. The use of MOS-cap as a varactor introduces second-order effects into the equation (7). Furthermore, derivation of equation (7) assumed that the floating-gate transistors including the variable capacitors $C_v$ are matched with respect to each other. Unfortunately, each floating-gate node is programmed to a different potential, which will lead to mismatch in $C_v$. In weak-inversion, however, the difference between respective gate-voltages is small (less than 100 mV), which reduces the effect of the mismatch. The variation of $C_v$ with respect to the tuning voltage $V_x$ is non-linear as shown in the measured response of FIG. 5. Therefore, $V_x$ and $V_c$ has to be biased properly to ensure: (a) sub-threshold biasing of the transistors; and (b) high-sensitivity of $C_v$ also varies with temperature. However, the temperature model of a MOS varactor is too complex for any closed-form calibration, which motivates adapting $V_x$ in an online manner.

Figure 5:
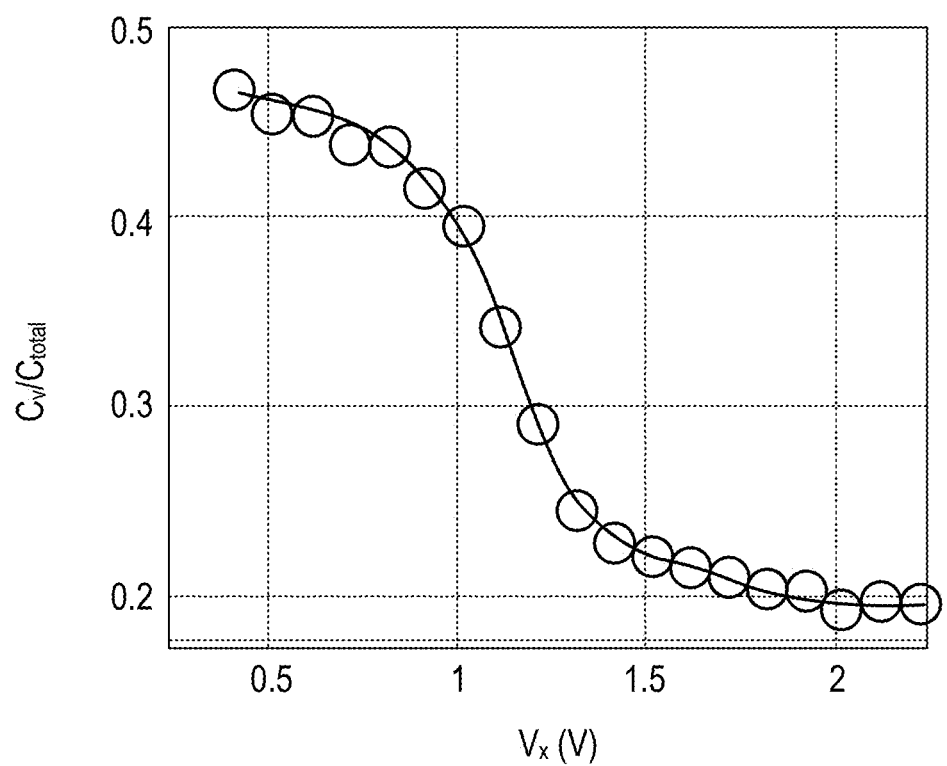
FIG. 5 is a graph illustrating a measured capacitance of the MOS varactor when $V_x$ is varied.

FIG. 5 shows the measured capacitance of a prototype accumulation-mode varactor that was fabricated in a 0.5-μm CMOS process. The response shows that, when the terminal voltage $V_x$ is varied, the capacitance decreases monotonically but nonlinearly. The differential change in capacitance with respect to $V_x$ can be adjusted by appropriately choosing the value of $V_x$. Note that, in FIG. 5, the largest differential change (highest sensitivity) in capacitance occurs at $V_x=1.25$ V (for a supply voltage of 3.3V). The result thus shows that $C_v$ can be varied over a large dynamic range by adapting $V_x$, which should be sufficient to achieve temperature compensation over a reasonable temperature range.

Figure 6:
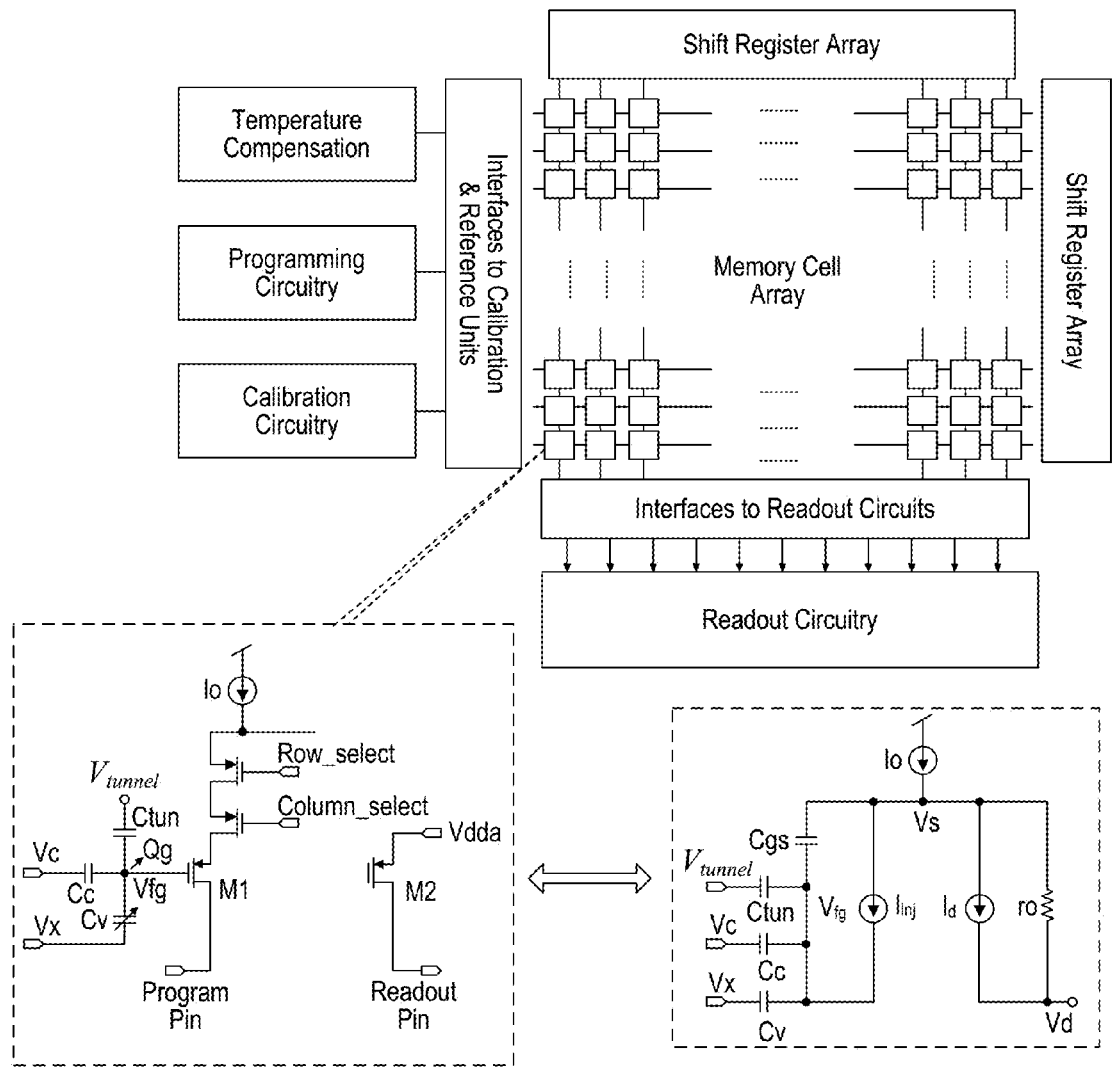
FIG. 6 is a schematic of a system architecture for an exemplary FG current memory array.

FIG. 6 shows a system-level architecture of a prototype temperature-compensated FG memory array. The array consists of 740 memory elements, each consisting of a programming transistor $M_1$ and a read-out transistor $M_2$. The memory cell can be selected using Ros_select and Column_select switches which are addressed using a serial shift register (shown in the inset of FIG. 6). $V_c$ is a common voltage applied to the FG control capacitor $C_c$ and is used for tuning the current flowing through all the memory elements. Each memory element also integrates a varactor which is used for temperature compensation according to the mathematical model described above. The memory array also consists of two reference FG transistors $P_1$ and $P_2$ (see FIG. 2, whose size and orientation are carefully matched to the elements of the array). As the ambient temperature varies, the varactor voltage $V_x$ is varied such that the ratio of the drain currents flowing through $P_1$ and $P_2$ is kept constant. An external digital signal processor (DSP) stores a mapping $R(V_x, T)$ which denotes the ratio of the currents (flowing through $P_1$ and $P_2$) as a function of the varactor voltage $V_x$ and the ambient temperature T. Then, the temperature compensation strategy for adapting $V_x$ uses the following variational model where the value of $R(V_x, T)$ is kept constant:

$$\frac{\partial R}{\partial V_x}\Delta V_x + \frac{\partial R}{\partial T}\Delta T = 0 \qquad (8)$$

where $\Delta T$ denotes the change in temperature. Therefore, the change in $\Delta V_x$ required to achieve temperature compensation is given by $$\Delta V_x = -\left(\frac{\partial R}{\partial V_x}\right)^{-1}\frac{\partial R}{\partial T}\Delta T. \qquad (9)$$

Next, we describe an approach that uses the feedback properties of the varactor to program the temperature-compensated FG memory to a desired value of current.

The common method for programming FG transistors is by using Fowler-Nordheim (FN) tunneling or by using hot-electron injection. FN tunneling removes the electrons from FG node when a high-voltage $V_{tunnel}(>15$ V in a 0.5-μm CMOS process) is applied across a parasitic nMOS capacitor $C_{tun}$. However, the use of high voltage also restricts the use of FN tunneling for selective programming, and, therefore, in many implementations, it is only used to globally erase the charge on all FGs.

Hot-electron injection, however, requires a lower voltage (≈4.2 V in 0.5-μm CMOS process) than tunneling and hence is the primary mechanism for selective programming of the FGs. The hot-electron programming procedure involves selecting of the FG transistor (using row and column switches in FIG. 6) followed by applying $V_{sd}$>4.2 V across the source and the drain terminal. The large electric field near the drain of the pMOS transistor creates impact-ionized hot-electrons whose energy when exceeds the gate-oxide potential barrier (≈3.2 eV) can get injected onto the FG. Because the hot-electron injection in a pMOS transistor is a positive feedback process and can only be used to add electrons to the FG, the process needs to be carefully controlled and periodically monitored to ensure the FG voltage is programmed to a desired precision. The methods proposed in literature achieve the desired precision either by adjusting the duration for which the FG transistor is injected or by adjusting the magnitude of the injection pulses. Other approaches involve a predictive technique where a six-parameter programming model is first estimated and then used to accurately program the FG transistors. Yet another approach involves using an active feedback method for linearizing the hot-electron injection current, which leads to a stable and predictable FG programming model. However, the linearization approach is only applicable for designing programmable voltage references. Here, we propose a linearization approach for programming currents on FG transistors and use the feedback properties of the varactor in conjunction with the feedback properties of the constant source current injection.

A constant current FG injector is shown in FIG. 6, which uses a direct programming method to inject electrons onto the FG. The source of the programming transistor $M_1$. is driven by a constant current source $I_0$. and $M_2$ is the pMOS used to read out the FG voltage (or charge). For the mathematical model presented in this section $V_c$, $V_{tunnel}$, and $V_x$ are assumed to be constant and the FG voltage $V_{fg}$ has been assumed to be properly initialized to a predetermined value $V_{fg0}$. Under these conditions, the current source drives the source node such that it creates a high enough electric field at the drain-to-channel region to trigger the onset of the injection process. As hot electrons are injected onto the FG node, the potential $V_{fg}$ decreases. Not only does this decrease the potential $V_8$, but it also modifies the value of the varactor $C_v$. To understand the dynamics of this circuit, an empirical model for the injection s combined with an empirical model of the pMOS transistor and the varactor. An equivalent circuit of this model is shown in FIG. 6, where $I_0$ denotes the source current, $I_d$ is the drain current, $I_{inj}$ is the injection current, $r_0$ is the drain-to-source impedance, $V_{s,d}$ is the source and drain voltages, $C_c$ is the FG capacitance, $C_{tun}$ is the tunneling capacitance, $C_b$ is the bulk capacitance, and $C_{gs}$ is the gate-to-source capacitance. It is important to note that the values of the currents $r_0$ and $C_{gs}$ are dependent on the voltages and currents and should not be confused with a small-signal model. A simple injection current model is used for this analysis which is given by $$I_{inj} = \beta I_0 \exp((V_s - V_d)/V_{inj}) \quad (10)$$

Where $\beta$ and $V_{inj}$ are injection parameters which are functions of the transistor size and the process parameters. The current source $I_0$ in FIG. 8 also ensures that the FG transistor is biased in weak-inversion. For those source-to-drain voltage $V_{ds}>200$ mV, the current $I_0$ can be expressed as $$I_0 = I_s \exp\left(\frac{-V_{fg}}{nU_T}\right) \exp\left(\frac{V_s}{U_T}\right) \quad (11)$$

where $I_s$ is the characteristic current, $V_{fg}$ and $V_s$ are the FG voltage and source voltage, respectively, n is the slope factor, and $U_T$ is the thermal voltage (26 mV at 300K). To derive Equation 11, we will first present all the nodal equations for the equivalent circuit in FIG. 6.

The injection current $I_{inj}$ changes the floating gate charge according to $$\frac{dQ_g}{dt} = I_{inj} = I_0 \exp\left(\frac{V_s}{V_{inj}}\right) \quad (12)$$

which is connected to the nonlinear capacitance seen at FG node F according to $$\frac{dQ_g}{dt} = C_T(V_x - V_{fg})\frac{dv_{fg}}{dt}. \quad (13)$$

Note that the function $C_T(V) = C_{fg} C_{tun} C_b + C_{gs} + C_v(V)$ exhibits a response shown in FIG. 5, where the capacitance monotonically decreases with voltage V. Solving (10), (11), and (12) lead to the following integral form:

$$\beta I_0 \left(\frac{I_0}{I_s}\right)^{\frac{U_T}{V_{inj}}} \int dt = \int C_T(V_x - V_{fg}) \times \exp\left(-\frac{V_{fg}}{nV_{inj}}\right) dV_{fg}. \quad (14)$$

This integral equation is difficult to solve since the closed form of the function $C_T(V)$ is not available. Therefore, we consider two cases for which the output current $I_{out}$ can be determined in closed form. Note that the current $I_{out}$ can be expressed in terms of the FG voltages $V_{fg}$ and $V_{dda}$ as $$I_{out} = I_0 \exp\left(\frac{-V_{fg}}{nU_T}\right) \exp\left(-\frac{V_{dda}}{U_T}\right) \quad (15)$$

Where $V_{dda}$ denotes the voltage applied on the drain of $M_2$ in FIG. 6. The first case is when $C_T(V) = C_T$ is constant. In this case, solving (14) and combining with (15) leads to $$I_{out}(t) = I_0 \exp\left(\frac{V_{dda}}{U_T}\right)(K_1 K_2 t + t_0)\frac{V_{inj}}{U_T} \quad (16)$$

where $K_1 = (\beta I_0/(nC_T - C_{gs}))$, $K_2 = 1/V_{inj}$, and $t_0 = \exp(-K_2 V_{s0})$. Equation (16) shows that the current programmed in the FG memory cell is a polynomial function with respect to the programming time. The coefficient of the polynomial is $V_{inj}/U_T \approx 4$ at room temperature for a 0.5-μm CMOS process.

For the second case, the integral (14) is first expressed as a function of $I_{out}$ using (16). Thus, $$\beta(I_s)^{1+\frac{U_T}{V_{inj}}} \exp\left(\frac{V_{dda}}{V_{inj}}\right) \int dt = \int C_T\left(V_x - nV_{dda} + nU_T \log\left(\frac{I_{out}}{I_0}\right)\right) \times I_{out}^{\frac{U_T}{V_{inj}}} dI_{out}. \quad (17)$$

Now, if $V_{dda}$ is chosen such that the term $C_T(V_x - nV_{dda} + nU_T \log((I_{out})/(I_0)))I_{out}^{(U_T)/(V_{inj})}$ is constant, then the solution of the integral equation (17) is linear with respect to programming time t and is given by $$I_{out}(t) = I_{out_0} + \alpha t \quad (18)$$

where $\alpha$ is a programming coefficient that is a function of $I_o$, $V_x$, and $V_{dda}$. Note that this linearization of the programming response is only possible due to the varactor feedback and is therefore unique to the proposed varactor-based FG memory architecture.

Figure 7:
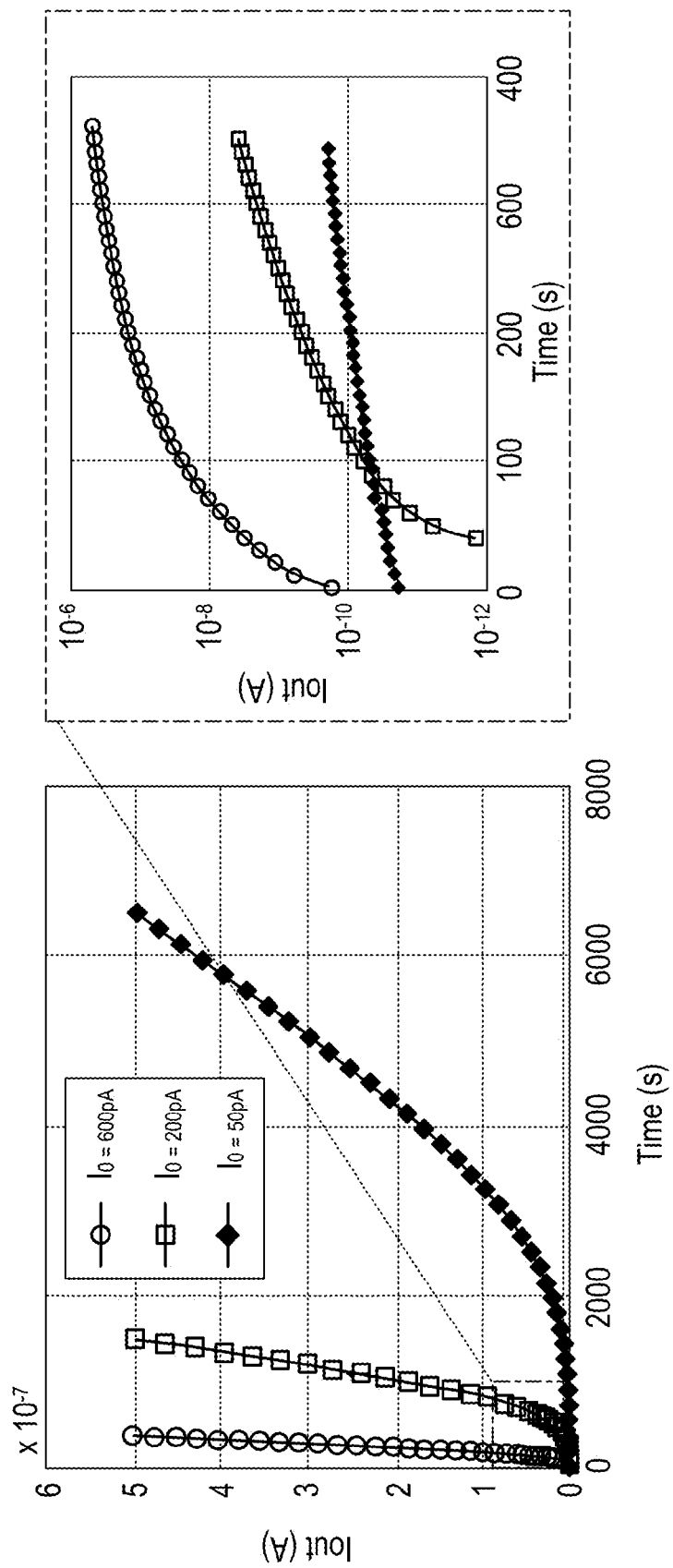
FIG. 7 is a graph illustrating the programmed current measured through the FG cell for different values of $I_0$.

FIG. 7 shows the output current $I_{out}$ measured from three different FG memory cells, when each cell is being programmed to the same current, however, using different values of $I_0$. For this experiment, the varactor voltage was set to $V_x=1.25$ V, where maximum differential change in capacitance can be measured. During the initial phases of the programming, the voltage difference across the varactor is large, as a result the capacitance at the FG $C_T$ is constant. Therefore, the programmed current should exhibit a polynomial response given by equation (16) and is clearly shown in FIG. 7. As the program current increases, the voltage difference across varactor reduces, as a result, the negative feedback and hence the linearizing effect of varactor on the programming current is observed. This is clearly shown in FIG. 7, which is modeled by (18).

Figure 8A:
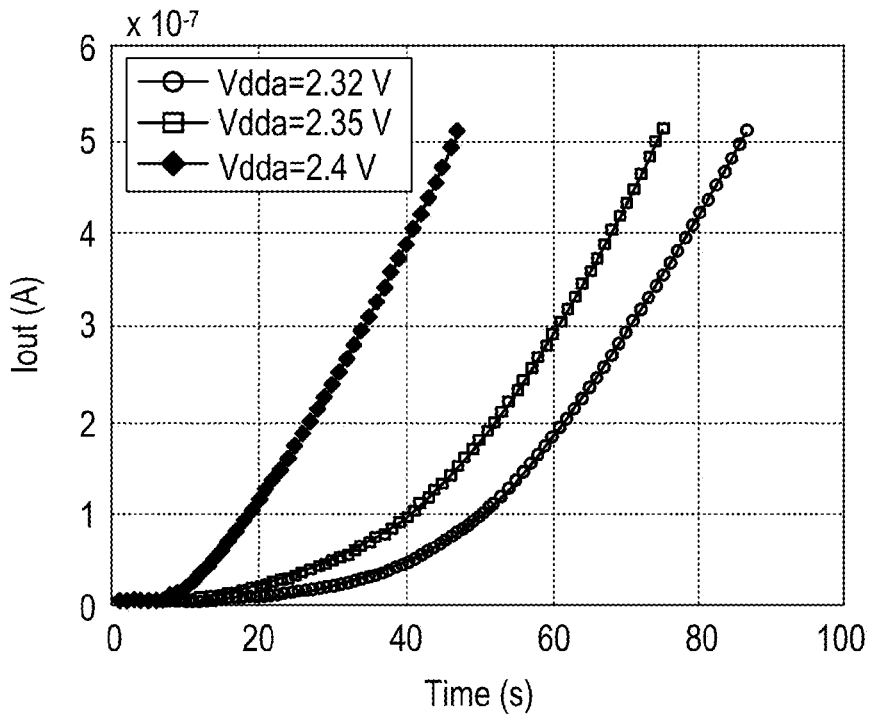
FIGS. 8A and 8B are graphs illustrating the programmed current measured through the FG cell for different values of $V_{dda}$.
Figure 8B:
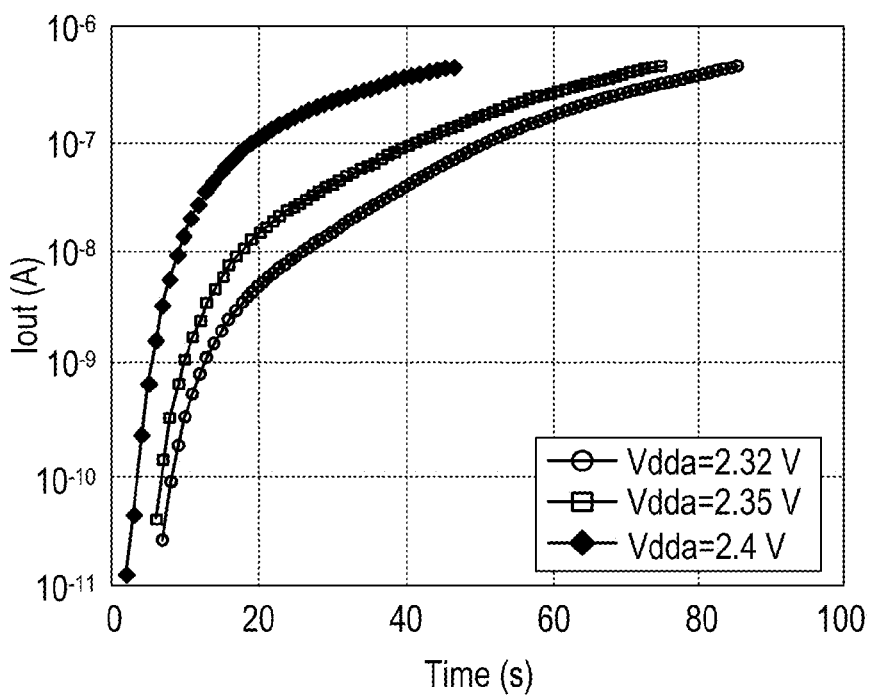

The onset of the linear region can be effectively controlled by adjusting the bias voltage $V_{dda}$ of the read-out transistor $M_2$ in FIG. 6. This effect is illustrated in FIG. 8 which shows the measured output current flowing through three different FG memory cells as they are being programmed. For each cell, a different value of $V_{dda}$ is used. It is seen from FIG. 8 that, as $V_{dda}$ is increased, the onset of the linear programming response also shifts left at an earlier time. Note that the speed of programming also increases which is consistent with the model given in equation (18).

A prototype temperature-compensated FG memory cell array has been fabricated in a 0.5-μm standard CMOS process. Table I summarizes the main specifications of the prototype.

TABLE I

SPECIFICATIONS OF THE FG CURRENT MEMORY

| | |
|---|---|
| Fabrication Process | Standard CMOS 0.5 μm |
| Die Size | 3000 μm × 3000 μm |

TABLE I-continued

SPECIFICATIONS OF THE FG CURRENT MEMORY

| Number of Current Memory Cells | 740 |
|---|---|
| Pitch size | 18 μm × 18 μm |

The first step to experimentally characterize the FG memory cell is to program all of the FG cells to the desired value of current. Programming procedure exploits the mathematical model described above and comprised of the following steps.

First, the currents through each FG cell is measured and is used to determine the overall current distribution. For this procedure, the serial-chain shift register (shown in FIG. 6) is used to sequentially select each cell and then measure its output current. The probability density function (PDF) of the measured current clearly shows threshold mismatch across the 533 FG cells. Note that, even though the current prototype integrates 740 FG cells, only 512 cells are required to demonstrate up to 9 b of programming capability.

The threshold voltage mismatch is then equalized using an initialization procedure. First, any residual charge on all FGs is erased using FN tunneling where 15 V is applied across to tunneling node $V_{tunnel}$. Note that this procedure global and erases all of the cells simultaneously. As a result, the current distribution shifts towards the left.

Figure 9:
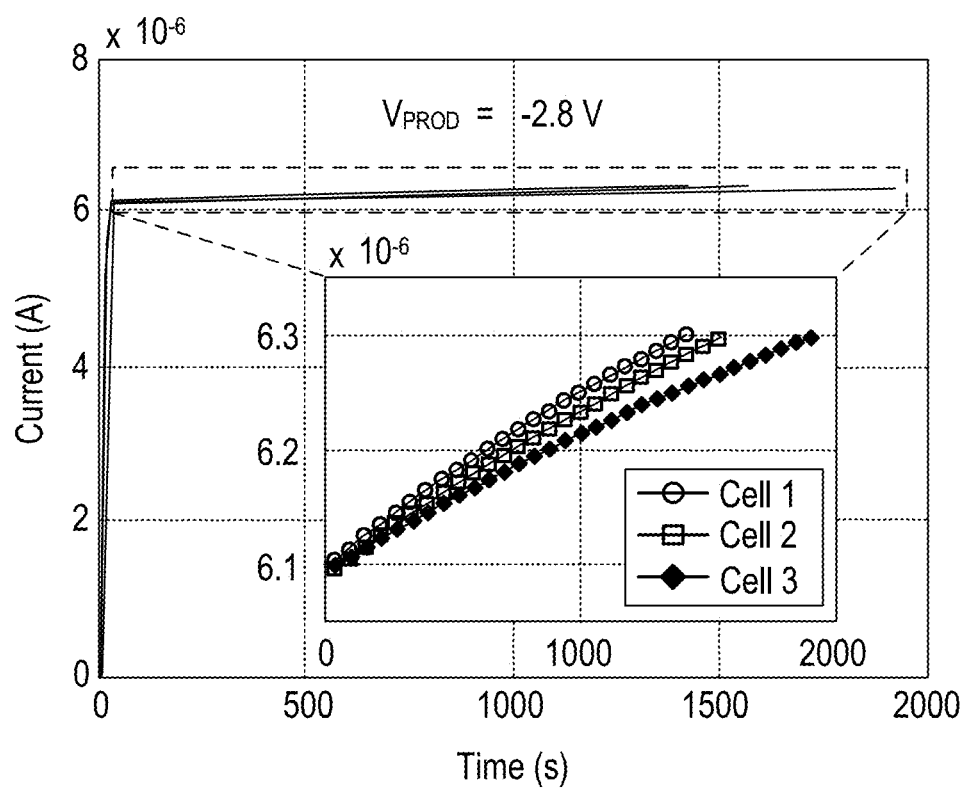
FIG. 9 is a graph illustrating the programming of the FG current memory using coarse and fine hot-electron injection.

To equalize all of the threshold voltages, each of the FG cell is selected using the serial-chain shift register. The drain voltage of the programming transistor ($V_d$ shown in FIG. 6) is pulsed to −3 V which then initiates the hot-electron injection procedure. The drain voltage is then set to 0 V and then the current flowing through the read-out transistor ($M_2$ shown in FIG. 6) is measured. Note that during the hot-electron injection procedure $V_c$, $V_x$, and $V_{tunnel}$ are held constant. Fast programming of the FG cells is achieved using a coarse-fine programming approach, where the rate of programming is changed by changing the value of $I_0$ in FIG. 6. This is illustrated in FIG. 9 for three FG cells, where during the initial phase of the programming, a larger programming rate is chosen, till the programmed value is within 10% of the desired value. Afterwards, a slower rate of hot-electron injection is chosen (as shown in FIG. 9) which allows precise programming of the current to the desired value. The procedure is repeated for all 533 FG cells till they are programmed to the same value of the current. The distribution of the measured current after all the cells are programmed to the same current. This result demonstrates that the mismatch due to initial threshold voltage variation has been effectively compensated by the initialization procedure.

After the initialization procedure, the FG cells are programmed to the desired current using a repeated program (inject) and measure cycle. Note that the programming procedure has to be repeated a few times to take into account release of injected electrons back into the channel (due to oxide traps).

Temperature compensation results using the FG memory array that has been programmed using the coarse-fine technique are now described. The packaged memory chip was mounted on a printed-circuit board which was placed inside a programmable environmental chamber. During each set of temperature measurements, the temperature inside the chamber was first allowed to stabilize and was also calibrated using a digital thermometer.

Figure 10A:
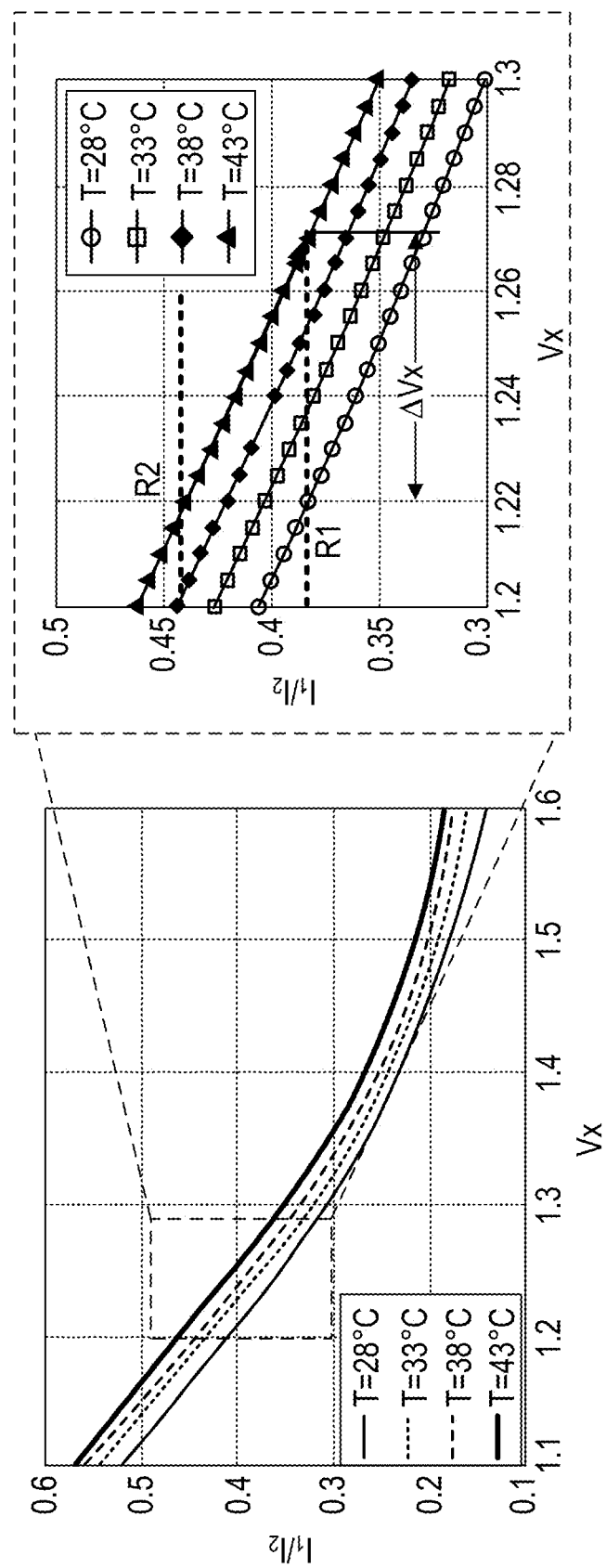
FIGS. 10A-10E are graphs illustrating the measured response of the FG memory array at different ratios of reference currents.
Figure 10B:
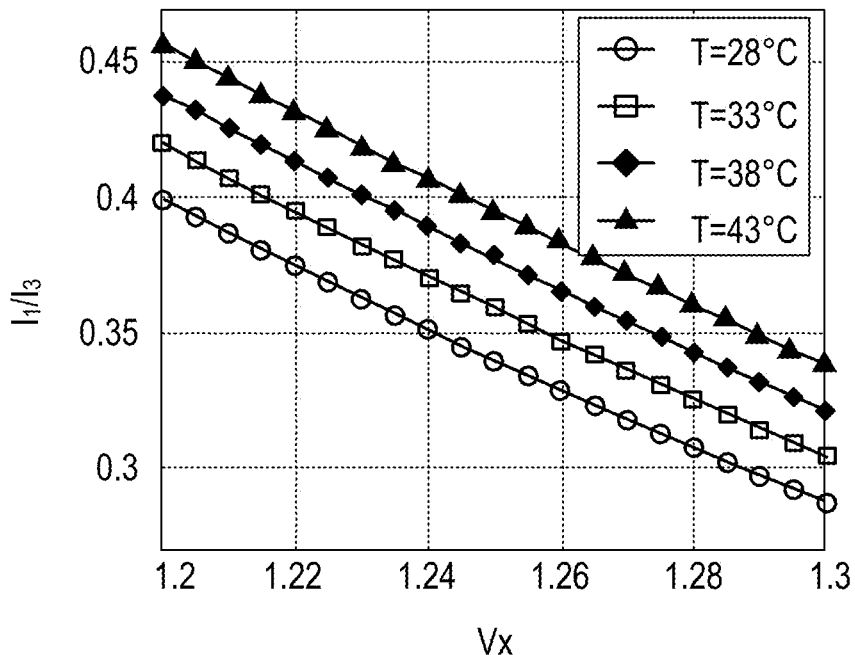
Figure 10C:
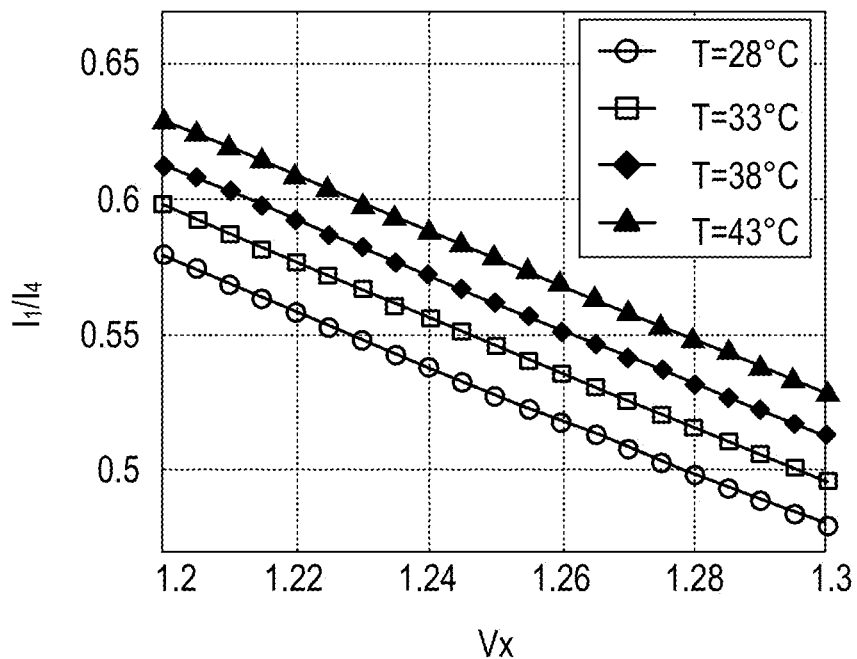
Figure 10D:
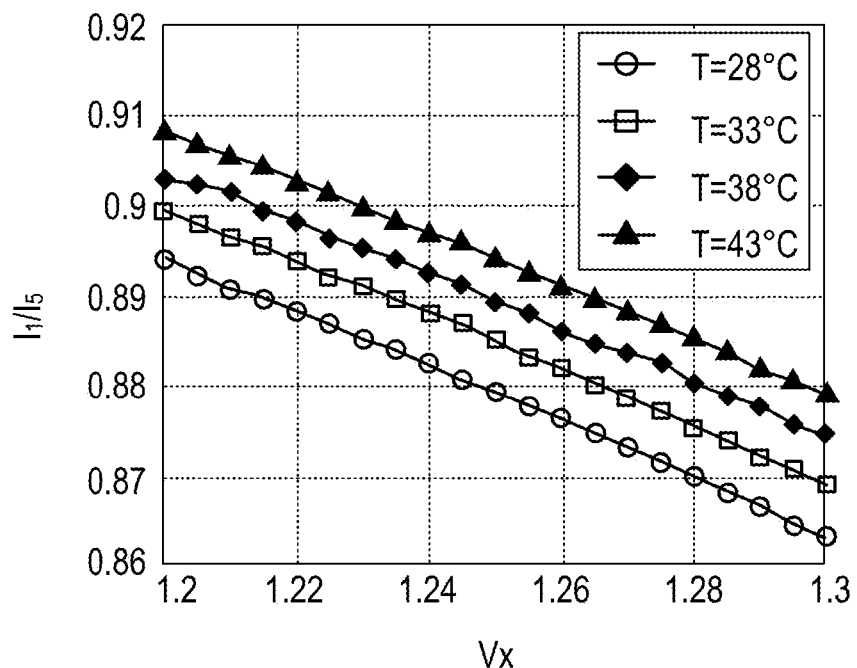
Figure 10E:
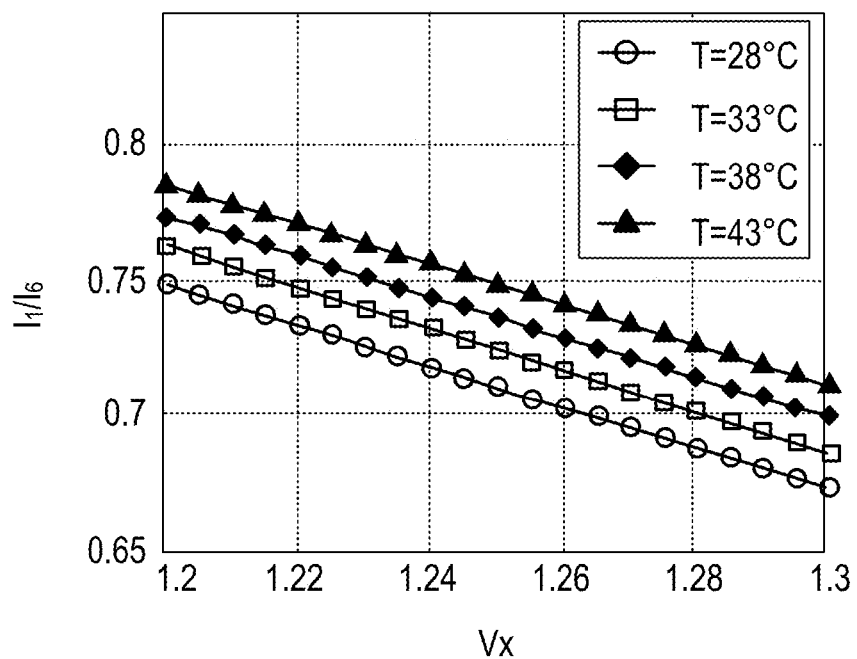

First, the current through the FG memory cells were measured as a function of the varactor voltage $V_x$ and under four different temperatures, namely, 28° C., 33° C., 38° C., and 43° C. For this experiment, the voltage $V_c$ was fixed to 2 V. FIG. 10A plots the ratio of reference currents $(I_1)/(I_2)$ as a function of $V_x$ and temperature T. It can be seen that, when $V_x$ is between 1.2 and 1.3 V, the ratio varies linearly with respect to $V_x$ as is highlighted in FIG. 10B. FIG. 10C-10E shows the measured current ratios for four other memory cells, each of which is programmed to a different current value (hence different current ratios). The measured response again shows that within the voltage range $1.2 \geq V_x \leq 1.3$, the current ratios vary linearly with $V_x$ and temperature T. To achieve temperature compensation, a linear function $R(V_x, T)$ representing the ratio of the currents through two reference cells $P_1$ and $P_2$ (see FIG. 2) is estimated. Any variation in temperature is compensated by adjusting $V_x$ according to the (12). The procedure is graphically illustrated in FIG. 10A, where increase in temperature from 28° C. to 42° C. increases the current ratio from $R_1$ to $R_2$. The varactor voltage $V_x$ is then reduced from $R_2$ back to $R_1$. Since $V_x$ is a global signal shared by all of the memory cells, their values (ratios) are adjusted accordingly so as to compensate for temperature variations.

Figure 11A:
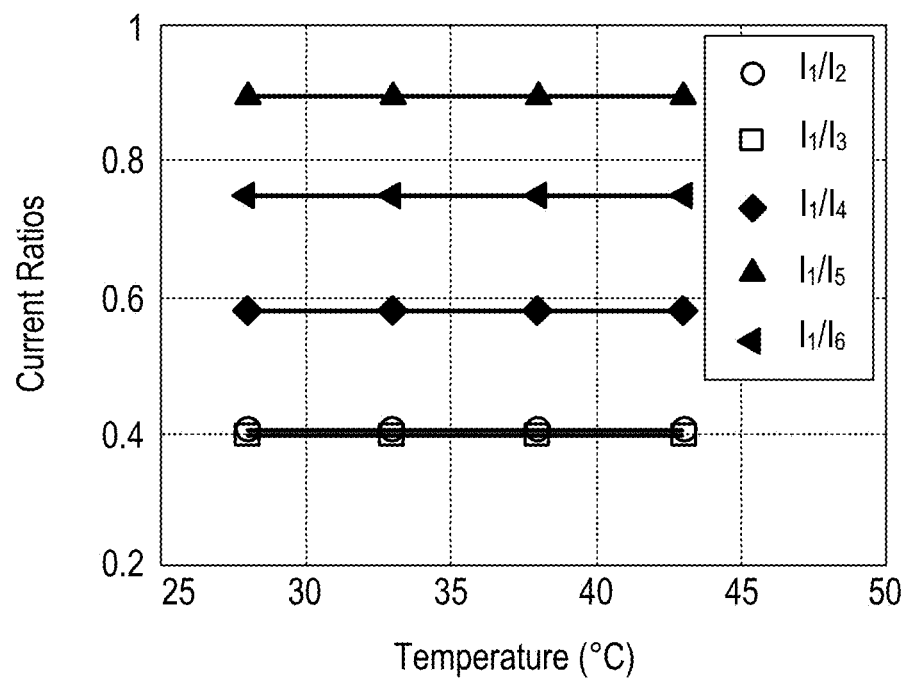
FIGS. 11A and 11B are graphs illustrating the measures response of the FG memory array at different values of $V_X$.
Figure 11B:
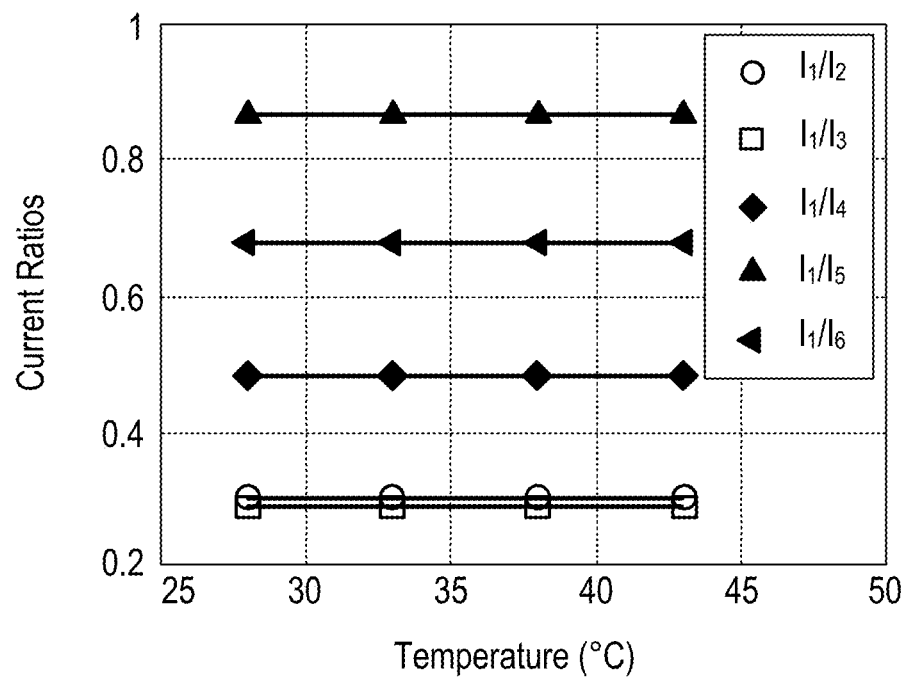
Figure 12:
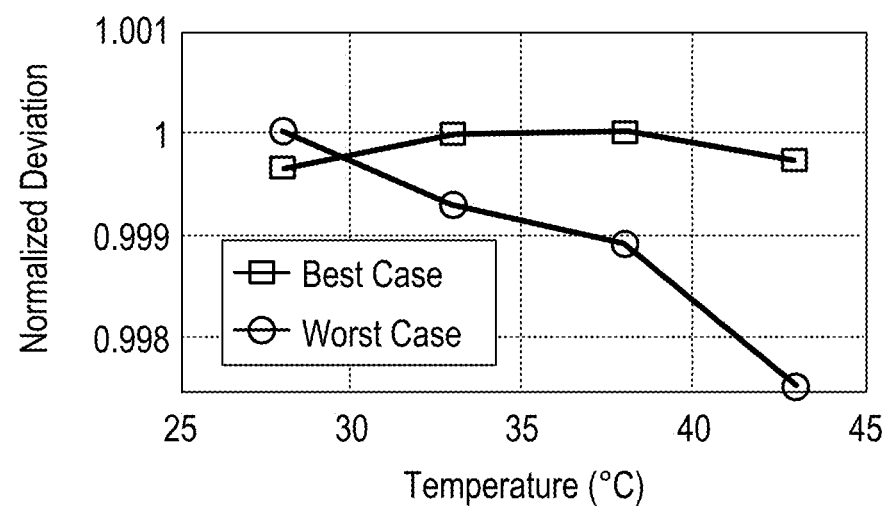
FIG. 12 is a graph illustrating the worst case and best case temperature compensation results.

FIGS. 11A and 11B show the result of the compensation, for four different memory cells and for different initial values of $V_x$. The results show that as the temperature is varied, the current ratios remain practically constant across multiple memory cells. The temperature compensated response remains invariant as long as the initial value of the $V_x$ is chosen to be within the linear operating region [see FIG. 12(a)]. FIG. 12 plots the result for an FG cell that exhibits the worst-case and best-case measured deviation with respect to temperature. The result demonstrates that the proposed varactor based compensation can achieve a temperature sensitivity ranging from 30 ppm/° K-150 ppm/° K over a temperature range of 28° C. to 43° C. The difference in compensation can be attributed to the mismatch between the FG memory cell and the FG cell used in the temperature compensation feedback loop. However, the worst case sensitivity is comparable or even better than a temperature compensated FG memory cell with an integrated resistor. The main advantage of the proposed approach is that the FG cell occupies a considerably smaller area and hence can achieve high integration density. The measured results thus validate the proof-of-concept that temperature compensation of large FG current memories can be achieved by integrating and controlling a varactor through a global feedback control loop.

In this disclosure, we have presented the design of a novel, compact array of FG current memory which is compensated for variations in temperature. The current stored in the memory cell is theoretically determined by the differential charge stored on the FG current references and our analysis indicate that temperature compensation can be achieved at current levels down to a few picoamperes. Using measured results from fabricated memory cells, we have demonstrated a proof-of-concept validation of the proposed compensation technique. Table II below compares some of the specification of the proposed implementation with other approaches that have been reported in literature.

TABLE II

COMPARISON OF PERFORMANCE

|  | Reference | | | | | |
|---|---|---|---|---|---|---|
|  | [21] | [22] | [23] | [24] | [5] | This work |
| Current Range | 0.774 µA | 526 µA | 144 µA | 9 nA | 16-50 µA | 10 pA-100 nA |
| Process | 3.0 µm | 0.18 µm | 0.18 µm | 0.35 µm | 0.5 µm | 0.5 µm |
| Supply | 3.5 V | 1 V | 1 V | 1.5 V | 2.3 V | 3.3 V |
| Compensation Range | 0-80° C. | 0-110° C. | 0-100° C. | 0-80° C. | 0-80° C. | 28-43° C. |
| Temperature Coefficient | 375 ppm/° K | 50 ppm/° K | 185 ppm/° K | 44 ppm/° K | <130 ppm/° K | 30-150 ppm/° K |
| Integration Density | Low | Low | Low | Low | Low | Highest |
| (Cell Area) | (0.2 mm$^2$) | — | (0.07 mm$^2$) | (0.035 mm$^2$) | (0.015 mm$^2$) | (0.00032 mm$^2$) |

It can be seen that our approach provides a clear advantage in terms of integration density (due to the use of a single varactor per FG cell) and the ability to program and store subthreshold currents, while achieving good temperature compensation. The quality of compensation could be further improved by considering the following limiting factors: 1) mismatch between different varactors and FG capacitances and 2) second-order effects where the charge stored on the FGs will alter the varactor response. Future work in this area will focus on mitigating some of these effects. Also, in this work, the control loop used for adjusting the varactor capacitance has been implemented off-chip. Note the power dissipation incurred by the off-chip module is normalized by the size of the FG array to account for the energy-efficiency of a single FG memory cell. For large size arrays, this power dissipation penalty could be minimal. Also note that the compensation loop need not be always active, as variations in ambient temperature is a relatively slow process. In the future, however, the feedback loop will be implemented on-chip using peripheral analog circuits which would obviate the need for off-chip modules. Other important issues relevant to analog FG current memory are data retention and programming speed. Data retention in analog FG memories fabricated in 0.5-µm CMOS process has been extensively characterized. For instance, it was reported that, over a ten-year observation period, the FG voltage drifts only by 0.5-µV, which has been consistent with our observation. With regard to programming speed of the FG memory, there exists a tradeoff with respect to the desired programming resolution. As a result, the proposed FG current memory can be programmed at different speeds using different variants of hot-injection programming techniques.

The techniques described herein, such as those implemented by the control module, may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A non-volatile memory arrangement, comprising:
    a first memory circuit having a floating gate transistor with a gate node and operating in weak-inversion mode, and a varactor with first terminal electrically coupled to the gate node of the floating gate transistor; and
    a control module electrically coupled to a second terminal of the varactor and operable to tune a voltage applied to the varactor, thereby compensating for temperature changes, wherein the first memory circuit further includes a tunneling capacitor coupled electrically to the gate node of the floating gate transistor and a control-gate capacitor coupled electrically to the gate node of the floating gate transistor, wherein the tunneling capacitor configured to receive an injection current for the first memory circuit.

2. The non-volatile memory arrangement of claim 1 wherein the varactor is further defined as a metal-oxide semiconductor capacitor operating in accumulation mode.

3. A non-volatile memory arrangement, comprising:
    a first memory circuit having a floating gate transistor with a gate node and operating in weak-inversion mode, and a varactor with first terminal electrically coupled to the gate node of the floating gate transistor;
    a first current reference circuit and a second current reference circuit, the first and second current reference circuit each having a floating gate transistor operating in a weak-inversion mode and a varactor having a first terminal electrically coupled to a gate node of the floating gate transistor; and
    a control module electrically coupled to a second terminal of the varactor and operable to tune a voltage applied to the varactor, thereby compensating for temperature changes.

4. The non-volatile memory arrangement of claim 3 wherein the control module is configured to receive a reference current from a drain of the floating gate transistor in each of the first and second current reference circuits, the control module operates to selectively determine a ratio between the reference currents received from the first and second current reference circuits and determine a tuning voltage in accordance with the ratio between the reference currents.

5. The non-volatile memory arrangement of claim 4 wherein the control module applies the tuning voltage to a second terminal of the varactor in the first memory circuit.

6. The non-volatile memory arrangement of claim 5 wherein the control module applies the tuning voltage to a first terminal of the varactor in each of the first and second current reference circuits.

7. The non-volatile memory arrangement of claim 4 further comprises a second memory circuit having a floating gate transistor operating in weak-inversion mode and a varactor with a first terminal electrically coupled to a gate node of the floating gate transistor, wherein the control module applies the tuning voltage to a second terminal of the varactor in the second memory circuit.

8. A non-volatile memory arrangement, comprising:
a first memory circuit having a floating gate transistor with a gate node and operating in weak-inversion mode, and a varactor with a first terminal electrically coupled to the gate node of the floating gate transistor;
a first current reference circuit having a floating gate transistor operating in a weak-inversion mode and a varactor with a first terminal electrically coupled to a gate node of the floating gate transistor;
a second current reference circuit having a floating gate transistor operating in a weak-inversion mode and a varactor with a first terminal electrically coupled to a gate node of the floating gate transistor; and
a control module configured to selectively receive a reference current from a drain of the floating gate transistor in each of the first and second current reference circuits and determine a ratio between the reference currents received from the first and second current reference circuits, the control module further operates to generate a tuning voltage that maintains the ratio between the reference currents constant and applies the tuning voltage to a second terminal of the varactor in the first memory circuit.

9. The non-volatile memory arrangement of claim 8 wherein the control module further operates to adjust the tuning voltage applied to the varactor of the first memory circuit.

10. The non-volatile memory arrangement of claim 8 wherein the control module applies the tuning voltage to a first terminal of the varactor in each of the first and second current reference circuits.

11. The non-volatile memory arrangement of claim 8 wherein the first memory circuit further includes a tunneling capacitor coupled electrically to the gate node of the floating gate transistor and a control-gate capacitor coupled electrically to the gate node of the floating gate transistor, wherein the tunneling capacitor configured to receive an injection current for the first memory circuit.

12. The non-volatile memory arrangement of claim 8 wherein the varactor of the first memory circuit is further defined as a metal-oxide semiconductor capacitor operating in accumulation mode.

13. A non-volatile memory arrangement comprising:
an array of memory circuits, each memory circuit having a floating gate transistor operating in weak-inversion mode and a varactor with a first terminal electrically coupled to a gate node of the floating gate transistor;
a first current reference circuit having a floating gate transistor operating in a weak-inversion mode and a varactor with a first terminal electrically coupled to a gate node of the floating gate transistor;
a second current reference circuit having a floating gate transistor operating in a weak-inversion mode and a varactor with a first terminal electrically coupled to a gate node of the floating gate transistor; and
a control module configured to selectively receive a reference current from a drain of the floating gate transistor in each of the first and second current reference circuits and determine a ratio between the reference currents received from the first and second current reference circuits, the control module further operates to generate a tuning voltage in accordance with the ratio between the reference currents and applies the tuning voltage to the varactor of each memory circuit in the array of memory circuits.

14. The non-volatile memory arrangement of claim 13 wherein the control module applies the tuning voltage to a first terminal of the varactor in each of the first and second current reference circuits.

15. The non-volatile memory arrangement of claim 13 wherein each memory circuit further includes a tunneling capacitor coupled electrically to the gate node of the floating gate transistor and a control-gate capacitor coupled electrically to the gate node of the floating gate transistor, wherein the tunneling capacitor configured to receive an injection current for the memory circuit.

16. The non-volatile memory arrangement of claim 13 wherein the varactor for a given memory circuit in the array of memory circuits is further defined as a metal-oxide semiconductor capacitor operating in accumulation mode.

* * * * *